(12) United States Patent
Guillorn et al.

(10) Patent No.: US 8,993,907 B2
(45) Date of Patent: *Mar. 31, 2015

(54) SILICIDE MICROMECHANICAL DEVICE AND METHODS TO FABRICATE SAME

(71) Applicant: International Business Machines Corporation, Armonk, NY (US)

(72) Inventors: Michael A. Guillorn, Yorktown Heights, NY (US); Eric A. Joseph, White Plains, NY (US); Fei Liu, Yorktown Heights, NY (US); Zhen Zhang, Ossining, NY (US)

(73) Assignee: International Business Machines Corporation, Armonk, NY (US)

(*) Notice: Subject to any disclaimer, the term of this patent is extended or adjusted under 35 U.S.C. 154(b) by 22 days.

This patent is subject to a terminal disclaimer.

(21) Appl. No.: 13/625,294

(22) Filed: Sep. 24, 2012

(65) Prior Publication Data

US 2013/0020183 A1    Jan. 24, 2013

Related U.S. Application Data

(63) Continuation of application No. 13/164,126, filed on Jun. 20, 2011, now Pat. No. 8,470,628.

(51) Int. Cl.
  *H01H 57/00*  (2006.01)
  *B81C 1/00*   (2006.01)
  *H01H 1/00*   (2006.01)

(52) U.S. Cl.
  CPC .......... *B81C 1/00666* (2013.01); *H01H 1/0094* (2013.01); *B81C 1/00952* (2013.01); *H01H 2001/0078* (2013.01)
  USPC ...................................... 200/181

(58) Field of Classification Search
  CPC ....... H01H 57/00; H01H 13/00; H01H 15/00; H03K 17/975
  USPC ......................... 200/181, 600, 16 D
  See application file for complete search history.

(56) References Cited

U.S. PATENT DOCUMENTS 6,074,890 A     6/2000 Yao et al.
6,194,678 B1 *  2/2001 Yoshikawa et al. ........... 200/512

(Continued)

FOREIGN PATENT DOCUMENTS

JP     2008119818    5/2008

OTHER PUBLICATIONS

Balan et al., "Platinum Silicide as Electrode Material of Microfabricated Quantum Electron Tunneling Transducers", XI International Conference and Seminar EDM '2010, Section II, Jun. 30-Jul. 4, Erlagol, pp. 159-164.

(Continued)

*Primary Examiner* — Edwin A. Leon
*Assistant Examiner* — Anthony R. Jimenez
(74) *Attorney, Agent, or Firm* — Harrington & Smith

(57) ABSTRACT

A miniaturized electro-mechanical switch includes a moveable portion having a contact configured to make, when the switch is actuated, an electrical connection between two stationary points. At least the contact is composed of a fully silicided material. A structure includes a silicon layer formed over an insulator layer and a micromechanical switch formed at least partially within the silicon layer. The micromechanical switch has a conductive structure, and where at least electrically contacting portions of the conductive structure are comprised of fully silicided material.

20 Claims, 6 Drawing Sheets

(56) References Cited

U.S. PATENT DOCUMENTS

| | | | |
|---|---|---|---|
| 6,768,403 B2 * | 7/2004 | Hsu et al. | 335/78 |
| 6,913,942 B2 | 7/2005 | Patel et al. | |
| 7,071,520 B2 | 7/2006 | Reid | |
| 7,582,940 B2 | 9/2009 | Ohguro | |
| 7,838,952 B2 | 11/2010 | Inaba et al. | |
| 7,859,067 B2 | 12/2010 | Partridge et al. | |
| 7,956,709 B2 | 6/2011 | Watanabe et al. | |
| 8,470,628 B2 * | 6/2013 | Guillorn et al. | 438/48 |
| 2007/0249082 A1 | 10/2007 | Hanaoka et al. | |
| 2009/0108381 A1 | 4/2009 | Buchwalter et al. | |
| 2009/0134513 A1 | 5/2009 | Qiu | |
| 2010/0038730 A1 * | 2/2010 | Sandhu et al. | 257/415 |
| 2010/0072042 A1 * | 3/2010 | Bertin et al. | 200/181 |
| 2010/0207216 A1 | 8/2010 | Drews et al. | |
| 2010/0330722 A1 | 12/2010 | Hsieh et al. | |
| 2011/0031564 A1 | 2/2011 | Inaba et al. | |

OTHER PUBLICATIONS

Farm, et al., "Selective-Area Atomic Layer Deposition Using Poly(methyl methacrylate) Films as Mask Layers", J. Phys. Chem C. 2008, Sep. 4, 2008, pp. 15791-15795.

Zhang et al., "Robus, Scalable Self-Aligned Platinum Silicide Process", Applied Physics Letters, 88 142114 (2006).

Chen et al., "Achieving Area-Selctive Atomic Layer Deposition on Patterned Substrates by Selective Surface Modification", Applied Physics Letters 86, 191910 (2005).

Au et al., "Selective Channel Vapor Deposition of Manganese Self-Aligned Capping Layer for Cu Interconnections in Microelectronics", Journal of the Electrochemical Society, 157 (6) D341-D345.

* cited by examiner

SILICIDE MICROMECHANICAL DEVICE AND METHODS TO FABRICATE SAME

CROSS-REFERENCE TO A RELATED PATENT APPLICATION

This patent application is a continuation patent application of copending U.S. patent application Ser. No. 13/164,126, filed Jun. 20, 2011, the disclosure of which is incorporated by reference herein in its entirety.

TECHNICAL FIELD

The exemplary embodiments of this invention relate generally to miniaturized electrical-mechanical devices, such as switches, and more specifically to micro-electrical-mechanical systems (MEMS) and to nano-electrical-mechanical systems (NEMS) and devices.

BACKGROUND

MEMS relate to a technology of very small electrically driven mechanical devices. MEMS converges at the nano-scale with NEMS and nanotechnology in general. MEMS are sometimes referred to as micro-machines or as micro systems technology (MST). MEMS include components between 1 to 100 micrometers in size, while MEMS devices can generally range in size from about 20 micrometers and larger. NEMS devices are smaller still. At the size scales of MEMS devices, and even more so NEMS devices, the standard constructs of classical physics are not always useful. Due at least to the large surface area to volume ratio surface effects, such as electrostatics and wetting, can dominate the volume effects such as inertia or thermal mass.

MEMS and NEMS can be fabricated using semiconductor device fabrication technologies normally used to make electronic devices. These include photolithographic patterning, sputtering, evaporation, and wet and dry etching.

SUMMARY

In a first aspect thereof the exemplary embodiments of this invention provide a switch that comprises a moveable portion comprising a contact configured to make, when the switch is actuated, an electrical connection between two stationary points. At least the contact is comprised of a fully silicided material.

In another aspect thereof the exemplary embodiments of this invention provide a structure that comprises a substrate comprising a silicon layer formed over an insulator layer and a micromechanical switch formed at least partially within the silicon layer, the micromechanical switch comprises a conductive structure, where at least electrically contacting portions of the conductive structure are comprised of fully silicided material.

In yet another aspect thereof the exemplary embodiments of this invention provide an electro-mechanical switch device fabricated by a process that comprises providing a silicon layer disposed over an insulating layer; releasing a portion of the silicon layer from the insulating layer so that it is at least partially suspended over a cavity in the insulating layer; depositing a metal on at least one surface of at least the released portion of the silicon layer; and fully siliciding at least the released portion of the silicon layer using the deposited metal, where the fully silicided released portion functions as a current carrying member of the switch device.

DETAILED DESCRIPTION

The use of NEMS (and MEMS) as switches in memory and other applications can be beneficial. For example, as compared to transistors electro-mechanical switches can reduce standby leakage current and potentially can exhibit improved sub-threshold behavior. However the large control gate voltage (typically some tens volts) and overall reliability are two issues that need to be addressed in order to use NEMS as switches.

A silicon-on-insulator (SOI) substrate can be used for NEMS applications. It has been demonstrated that the co-integration of complementary metal oxide semiconductor (CMOS) and NEMS technologies can be achieved using SOI wafers.

A silicide can be considered as a compound, for example a binary compound, of silicon and another element, such as a metal. The use of a silicide (including platinum silicide (PtSi)) can dramatically improve NEMS reliability. Moreover, silicide NEMS may exhibit superior mechanical properties as compared to SOI NEMS. For example, high reliability PtSi atomic force microscope (AFM) conducting tips show that they can sustain high currents (>1 mA).

However, there are issues associated with fabricating silicide NEMS structures. For example, one issue relates to silicide-induced stress to the Si, resulting in bending of the Si-containing portion of the NEMS structure after release (i.e., release from the starting SOI wafer of a part of the NEMS device). Further by example, a conventional wet chemical etch (e.g., one based on hydrofluoric (HF) acid) when applied during or after release can attack the silicide resulting in corrosion. In general, a wet chemical etch can be disadvantageous for achieving the NEMS release and subsequent processing as it can result in an increase in NEMS stiction. Stiction may be generally defined as a force required to cause one body that is in contact with another body to begin to move.

Disclosed herein are process flows and structures to avoid at least the problems related to excess stress induced into a Si member by silicide, the corrosion of the silicide and NEMS stiction.

It is pointed out that the teachings of this invention are not limited to the fabrication of NEMS devices per se, but can be applied as well to the fabrication of MEMS devices and, in general, to the fabrication of a variety of miniaturized electrical-mechanical systems and devices.

Figure 1:
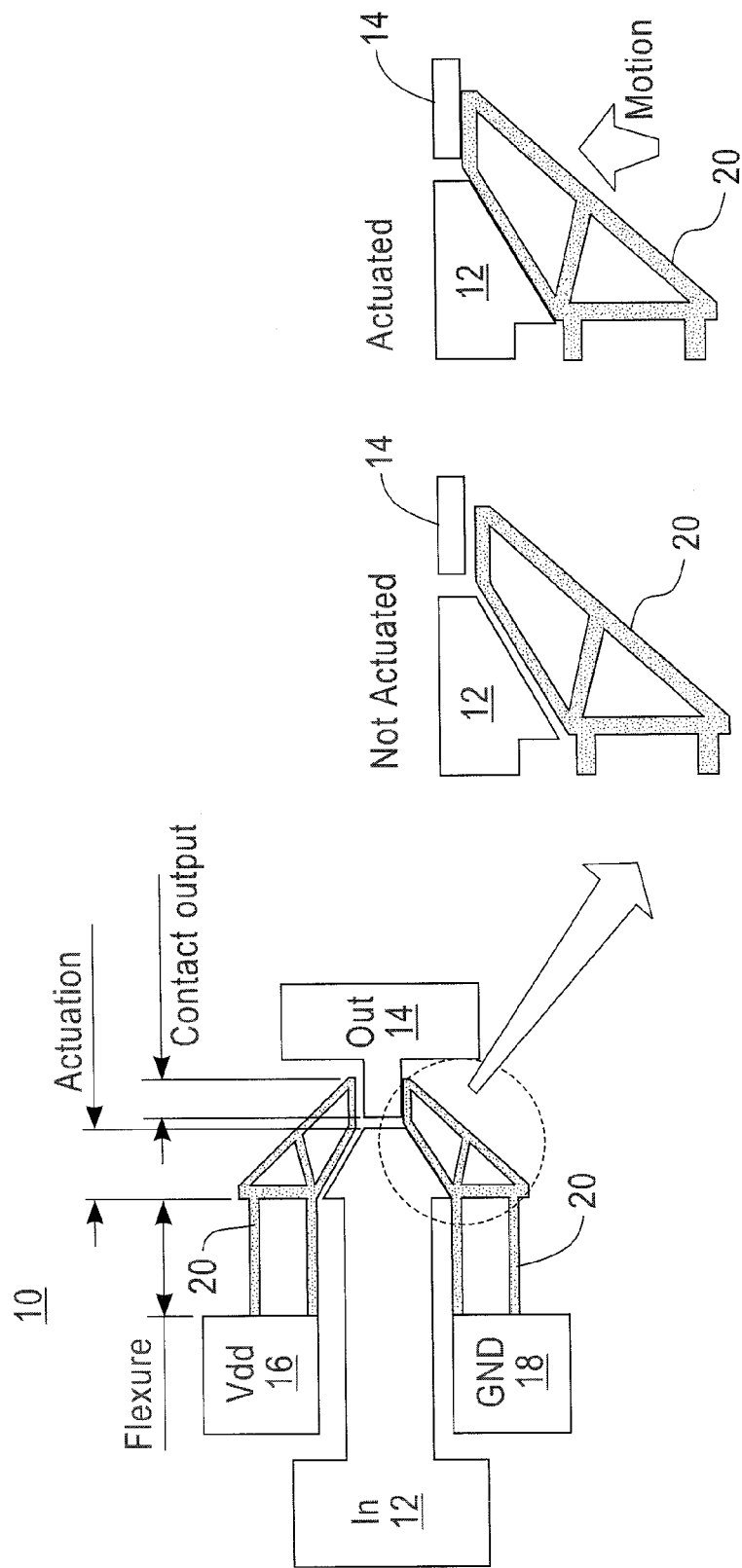
FIG. 1 is a top enlarged view of one non-limiting embodiment of a (symmetrical) NEMS switch that can be constructed using the exemplary embodiments of this invention using a starting SOI wafer.

FIG. 1 is a top enlarged view of one exemplary and non-limiting embodiment of a (symmetrical) NEMS switch 10 that could be constructed using the exemplary embodiments of this invention using a SOI wafer. The structure shown may be formed to have a total area of less than 5 $\mu m^2$. The switch 10 includes an input terminal 12, an output terminal 14 and control electrodes or terminals 16 and 18 (designated Vdd and GND, respectively.) The application of a suitable control input to the terminals 16 and 18 results in flexure (motion) of a moveable at least partially electrically conductive structure 20 between a not actuated state and an actuated state. When in the actuated state (the switch is turned on) an electrically conductive path is established between the input terminal 12 and the output terminal 14 via the electrically conductive portion of the structure 20 that physically contacts the input terminal 12 and the output terminal 14.

In accordance with an aspect of the exemplary embodiments of this invention at least the electrically contacting portions of the conductive structure 20 are fully silicided (thereby avoiding any bending or other deformation of silicon material), and during fabrication of the switch 10 the moveable electrically conductive structure 20 is released from the starting SOI wafer prior to being silicided. As a result, no wet etch processing need be performed subsequent to the release of the moveable electrically conductive structure 20 from the starting SOI wafer (and the siliciding of the moveable electrically conductive structure 20). The stiction problem is thus also avoided by avoiding the use of the wet chemical etch as the potential for the presence of corrosion, contaminates and other undesirable products is reduced or eliminated.

Reference is now made to FIGS. 2A-2D for showing an exemplary initial process flow in accordance with the exemplary embodiments of this invention. It can be noted that while a single released member is shown as being formed, in practice a large number of such released members can be simultaneously formed.

Figure 2A:
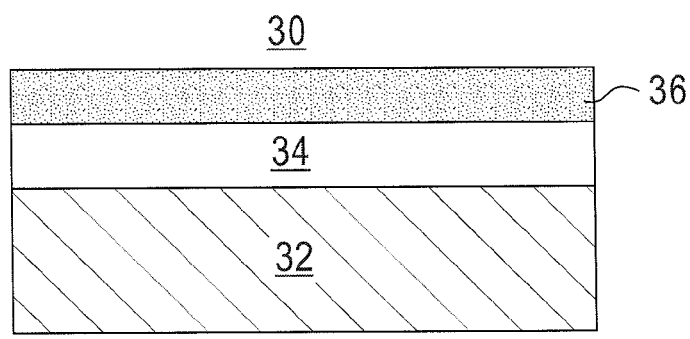
FIGS. 2A-2D, collectively referred to as FIG. 2, show an exemplary initial process flow in accordance with the exemplary embodiments of this invention.

In FIG. 2A a starting SOI wafer 30 is provided. The SOI wafer 30 includes a substrate (e.g., Si) 32, a layer of buried insulator or buried oxide (BOX) 34, such as $SiO_2$, and an overlying layer of Si 36. The substrate 32 can have any suitable thickness. The BOX 34 can have a thickness in the range of, for example, about 100 nm to about 200 nm, with about 140 nm being one suitable value. The Si layer 36 can have a thickness in the range of, for example, about 50 nm to about 100 nm, with about 80 nm being one suitable value.

Note that these thicknesses are merely exemplary, as the embodiments of this invention can be practiced as well using an extremely thin SOI (ETSOI) wafer, where the BOX layer may have a thickness of about 50 nm or less and where the overlying layer of Si may have a thickness of about 10 nm or less.

Figure 2B:
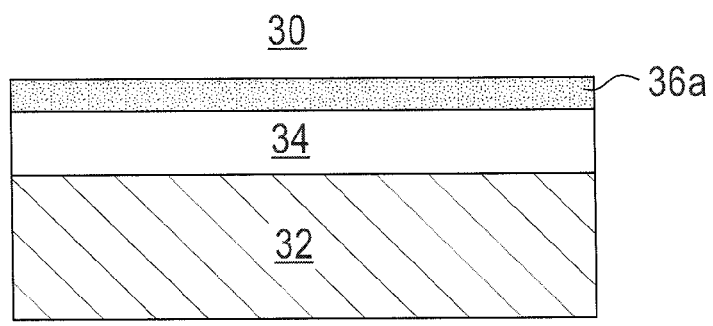

In FIG. 2B the Si layer 36, in which the NEMS structure will be fabricated, is thinned to a desired thickness in a range of about 20 nm to about 50 nm, with about 30 nm being one suitable value. The thinned layer of Si is designated as 36a.

Figure 2C:
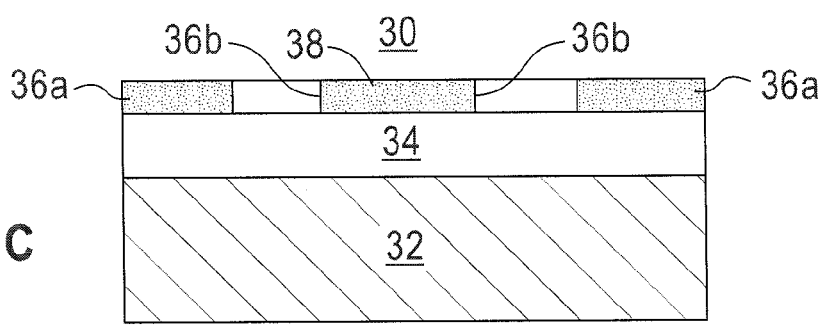

In FIG. 2C the Si layer 36a is masked and patterned and a reactive ion etch (RIE) process is used to selectively remove a portion of the Si layer 36a to delineate the desired NEMS structure. In FIG. 2C the delineated portion is designated 38 and can correspond to, for example, what will form a part of the moveable electrically conductive structure 20 shown in FIG. 1. This process also forms what may be referred to as openings or apertures 36b through the thinned Si layer 36a.

Figure 2D:
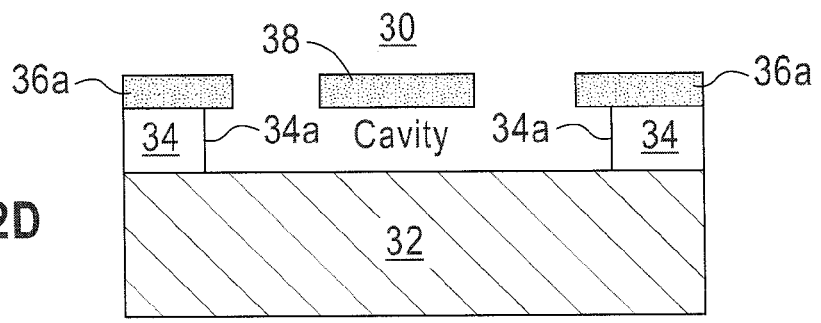

In FIG. 2D a vapor HF process is performed to completely remove through the apertures 36b the underlying BOX material beneath the delineated portion 38, thereby forming a cavity within the BOX material and releasing the delineated portion 38 from the BOX layer 34 (a region of connection between the released delineated portion 38 and the Si layer 36a is not shown in FIG. 2D). The result of the vapor HF etch process also serves to undercut to some distance the material of the BOX layer 34 beneath the Si layer 36a, thereby recessing sidewalls 34a of the BOX cavity away from the apertures 36b.

FIG. 2 can be considered to illustrate precursor processing steps to the actual silicide process that will be described in the several embodiments (process flow variations) found in FIGS. 3, 4, 5 and 6.

Figure 3A:
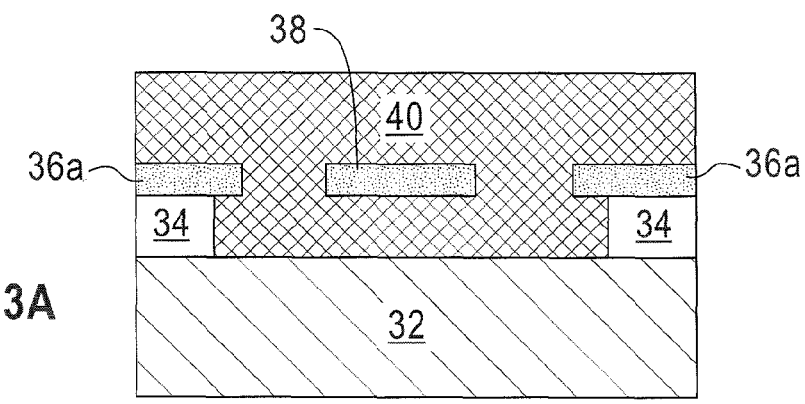
FIGS. 3A-3E, collectively referred to as FIG. 3, show a first process flow variation to form a silicided suspended (released) member that comprises a part of a NEMS device.
Figure 3B:
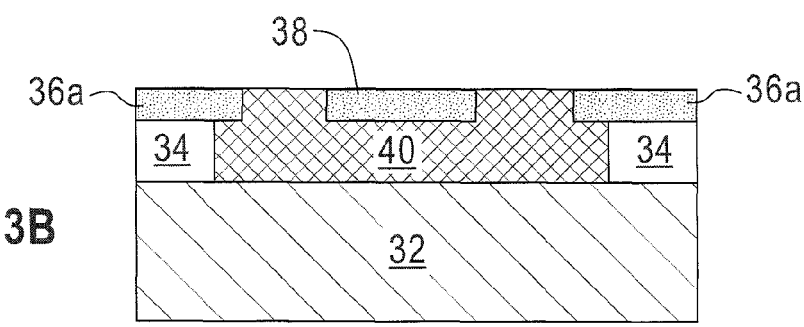
Figure 3C:
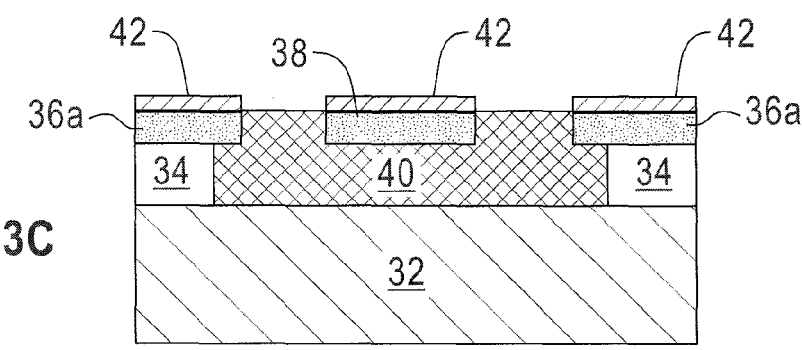
Figure 3D:
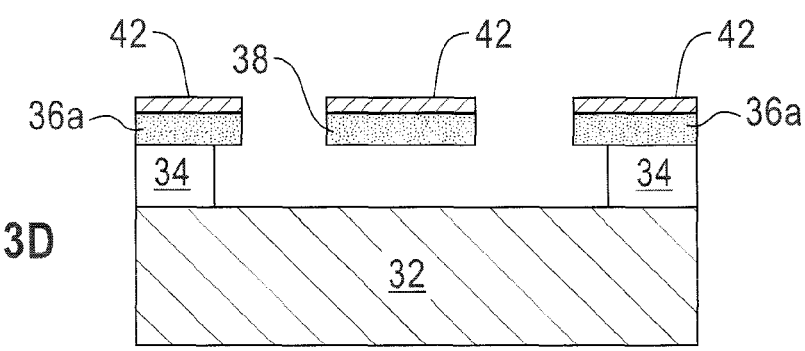
Figure 3E:
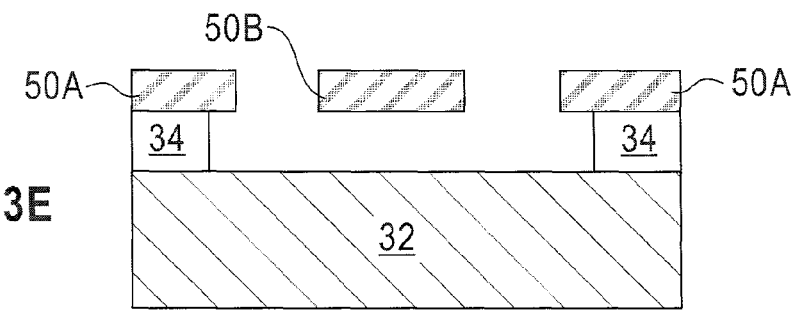

FIGS. 3A-3E show a first process flow variation (embodiment) to form a fully silicided suspended (released) member that comprises a part of a NEMS device such as the switch 20 shown in FIG. 1. In FIG. 3A a layer 40 of carbon is deposited so that it covers the structure depicted in FIG. 2D and fills the void beneath the delineated and released portion 38 that resulted from the vapor HF etch process. Chemical vapor deposition or plasma enhanced chemical vapor deposition from a suitable precursor, such as acetylene or ethylene are suitable techniques to deposit the carbon layer 40. During the carbon deposition process the conditions can be: 785 W high frequency RF, 6 Torr, 550° C., 600 sccm $C_3H_6$, 326 sccm He. In FIG. 3B the carbon layer 40 is etched back, such as by using an oxygen or a hydrogen based plasma, to reveal the top surfaces of the Si layer 36a and the Si delineated released portion 38. During etch-back process the conditions can be: 1) 30 mTorr/700Ws/300Wb/260$NH_3$/NSTU (reverse): 3/CS-TUi 8/15-15 (no $CHF_3$); 2) 4 mTorr/400Ws/100Wb/100$N_2$/14$O_2$/20Ar/2$C_2H_4$. In FIG. 3C a selective atomic layer deposition of a metal, such as platinum (Pt), is performed to cover the exposed surfaces of the Si layer 36a and the Si delineated released portion 38 with a Pt layer 42. The thickness of the deposited Pt is preferably sufficient to cause the underlying Si material to be fully consumed and silicided during subsequent thermal processing. As a non-limiting example, and if one assumes that the Si thickness of the released portion 38 is in a range of about 20 nm to about 50 nm, then the thickness of the Pt layer 42 can be in a range of about 15 nm to about 40 nm. In FIG. 3D the remaining carbon layer 40 is removed such as by the use of the oxygen or hydrogen based plasma, and the carbon removal conditions can be the same as those shown above for the carbon etch-back process of FIG. 3B. In FIG. 3E a reaction anneal process is performed so as to fully silicide the suspended NEMS structure corresponding to the Si delineated released portion 38 having the Pt layer 42. The reaction anneal also fully silicides the Si layer 36a. The reaction anneal can be performed using the conditions: 500° C. 30 seconds in $N_2$ then 600° C. 60 seconds in $O_2$. More generally the reaction anneal can be performed at a temperature in a range of about 300° C. to about 750° C. and the time adjusted accordingly.

The resulting NEMS structure thus has a fully silicided suspended (released) member 50B and fully silicided fixed members 50A (that can form electrodes or other electrically conductive features). By "fully silicided" what is meant is that there is substantially no residual Si remaining, as the Si has been reacted with the metal (Pt in this example) to form a silicide (PtSi in this example). The problem relating to the stress-induced bending of a suspended (partially) silicided Si beam or member is thus overcome, as the Si that formed what was originally the released portion 38 has been substantially completely replaced by the PtSi. In addition, no wet chemical processing was used after release (FIG. 2D), thereby avoiding any degradation of the silicide and also reducing the potential for excessive stiction to occur.

Figure 4A:
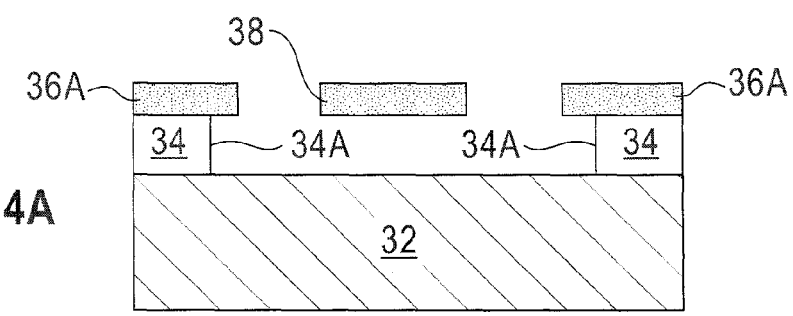
FIGS. 4A-4C, collectively referred to as FIG. 4, show a second process flow variation to form the silicided suspended (released) member that comprises a part of a NEMS device.
Figure 4B:
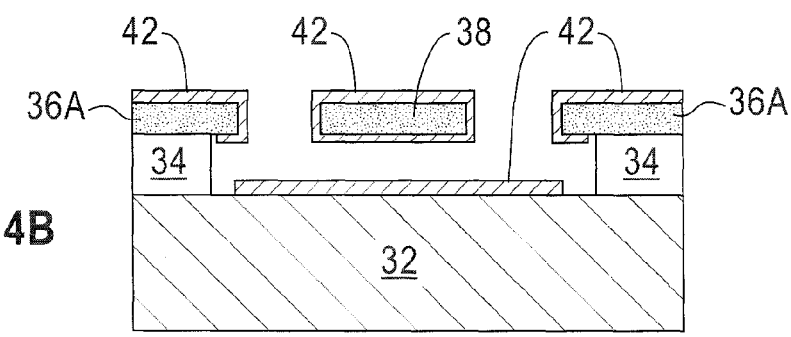
Figure 4C:
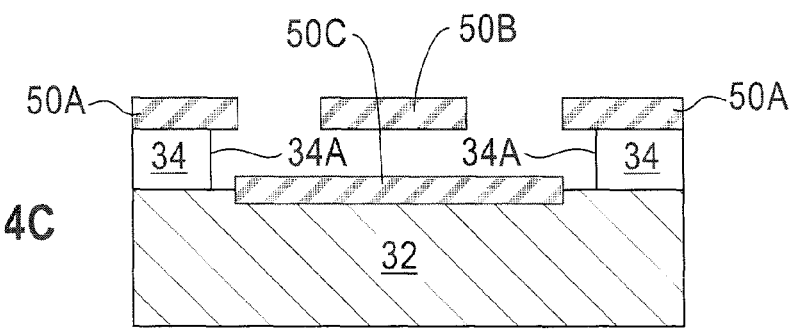

FIGS. 4A-4C show a second process flow variation (embodiment) to form the silicided suspended (released) member that comprises a part of a NEMS device, such as the switch 20 shown in FIG. 1. In FIG. 4A an oxide passivation step is performed using self-assembled monolayers (SAM), such as octadecyltrichlorosilane ODTS SAMs. As is known selective area ALD can use SAM as ALD growth-preventing mask layers. The SAM passivates the surface against ALD growth so that the film is deposited only on areas without a SAM. SAMs can be formed spontaneously through adsorption to a solid surface from a liquid or a gas phase. Reference can be made, for example, to E. Farm et al., Selective Area Atomic Layer Deposition Using Poly(methyl methacrylate) Films as Mask Layers, *J. Phys. Chem. C.* 2008, 112, 15791-15795.

In the example of FIG. 4A the sidewalls 34A of the insulating layer 34 have SAM formed thereon. The SAM can be a polymer such as the above-mentioned octadecyltrichlorosilane ODTS SAMs or any suitable material. In FIG. 4B selective ALD Pt deposition is performed. In this case, and in contrast to FIG. 3D, the Pt layer 42 is formed on all exposed surfaces with the exception of the sidewalls 34A where the SAM was formed. In FIG. 4C a reaction anneal process (e.g., a rapid thermal anneal (RTA) in an $N_2$ atmosphere) is performed so as to full silicide the suspended NEMS structure corresponding to the Si delineated released portion 38 having the Pt layer 42. The reaction anneal also fully silicides the Si layer 36a, as well as underlying portion of the Si substrate 32 having the Pt layer 42 deposited thereon. The reaction anneal can be performed using the conditions: 500° C. 30 seconds in $N_2$ then 600° C. 60 seconds in $O_2$. More generally the reaction anneal can be performed at a temperature in a range of about 300° C. to about 750° C. and the time adjusted accordingly. Note that the SAM will selectively deposit to the BOX and will thus prevent metal (Pt) deposition on the side wall of the BOX.

After the reaction anneal process of FIG. 4C the SAM can be removed from the BOX sidewalls using the conditions: 1) 30 mTorr/700Ws/300Wb/260NH$_3$/NSTU (reverse): 3/CS-TUi 8/15-15 (no CHF$_3$); 2) 4 mTorr/400Ws/100Wb/100N$_2$/14O$_2$/20Ar/2C$_2$H$_4$.

The resulting NEMS structure thus has a fully silicided suspended (released) member 50B and fully silicided fixed members 50A, in addition to a fully silicided conductive area 50C that underlies the fully silicided suspended (released) member 50B. In that the sidewalls 34A were not exposed to the Pt ALD, there need be no direct electrical path from the silicided fixed members 50A or the silicided suspended (released) member 50B to the fully silicided conductive area 50C. As in the embodiment of FIG. 3 the problem relating to the bending of a suspended silicided Si beam or member is thus overcome, as the Si that formed what was originally the released portion 38 has been completely replaced by the PtSi. In addition, no wet chemical processing is used after release (FIG. 2D), thereby avoiding any degradation of the PtSi and also reducing the potential for stiction to occur.

Figure 5A:
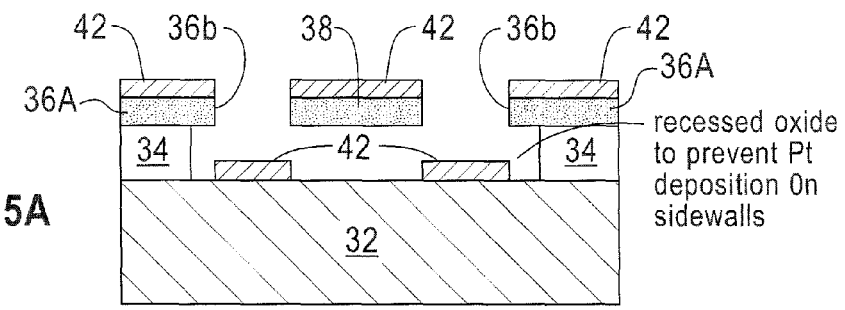
FIGS. 5A and 5B, collectively referred to as FIG. 5, show a third process flow variation to form the silicided suspended (released) member that comprises a part of a NEMS device.
Figure 5B:
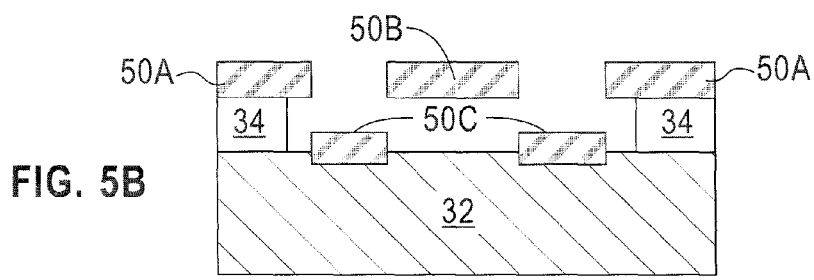

FIGS. 5A and 5B show a third process flow variation to form the silicided suspended (released) member that comprises a part of a NEMS device, such as the switch 20 shown in FIG. 1. The process shown in FIG. 5 is similar in some respects to the process shown in FIG. 4, as both begin with the structure produced as a result of the processing steps shown in FIG. 2. However, in FIG. 5A the layer 42 of Pt is formed not by ALD, as in FIG. 4B, but by a Pt evaporation process. As a result the Pt deposition occurs only on those surfaces directly exposed to the flow of evaporated Pt, and in this case then the Si delineated released portion 38 acts as a mask to inhibit Pt deposition on the underlying surface of the Si substrate 32. As a result the Pt layer 42 is formed on the top surfaces of the layer 36a, the released portion 38 and that portion of the surface of the Si substrate 32 that is exposed through the apertures 36b. Due to the presence of the recessed oxide (as a result of the processing performed in FIG. 2D) the sidewalls 34a of the BOX 34 are substantially free of deposited Pt as well. In FIG. 5B the reaction anneal process is performed so as to full silicide the suspended NEMS structure corresponding to the Si delineated released portion 38 having the Pt layer 42. The reaction anneal also fully silicides the Si layer 36a, as well as the underlying portions of the Si substrate 32 having the Pt layer 42 deposited thereon. As before, the reaction anneal can be performed using the conditions: 500° C. 30 seconds in $N_2$ then 600° C. 60 seconds in $O_2$. More generally the reaction anneal can be performed at a temperature in a range of about 300° C. to about 750° C. and the time adjusted accordingly.

The resulting NEMS structure thus also has a fully silicided suspended (released) member 50B and fully silicided fixed members 50A, in addition to two fully silicided conductive areas 50C that underlie the apertures 36b on both sides of the fully silicided suspended (released) member 50B. In that the recessed sidewalls 34A were not exposed to the Pt evaporation flow, there need be no direct electrical path from the silicided fixed members 50A or the silicided suspended (released) member 50B to the fully silicided conductive areas 50C. As in the embodiment of FIGS. 3 and 4 the problem relating to the bending of a suspended silicided Si beam or member is thus overcome, as the Si that formed what was originally the released portion 38 has been completely replaced by the Pt silicide. In addition, no wet chemical processing was used after release (FIG. 2D), thereby avoiding any degradation of the silicide and reducing the potential for stiction to occur.

Figure 6A:
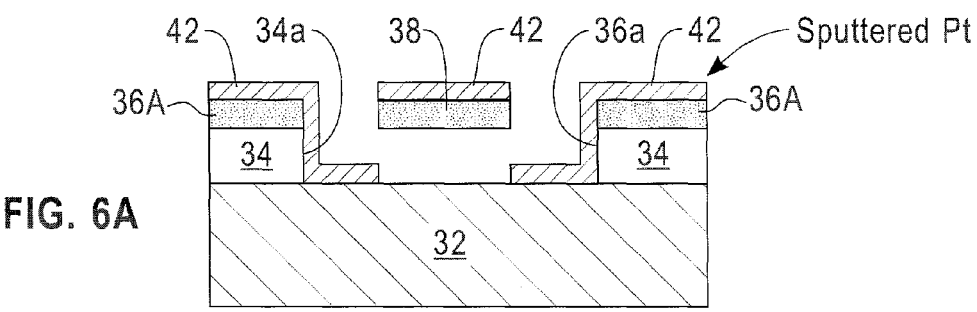
FIGS. 6A-6E, collectively referred to as FIG. 6, show a fourth process flow variation to form the silicided suspended (released) member that comprises a part of a NEMS device.
Figure 6B:
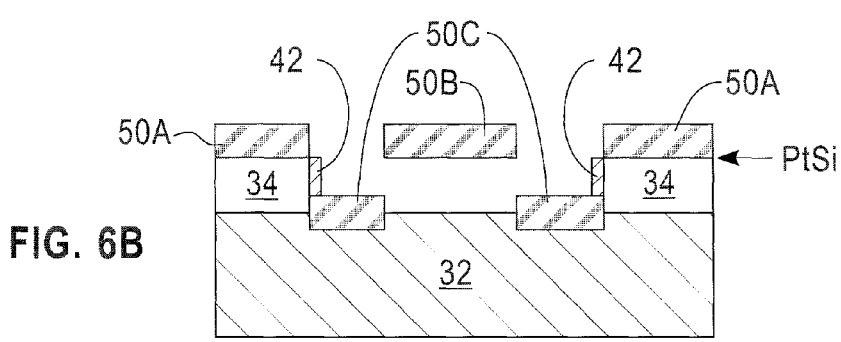

FIGS. 6A through 6E show a fourth process flow variation to form the silicided suspended (released) member that comprises a part of a NEMS device, such as the switch 20 shown in FIG. 1. The process shown in FIG. 6 begins with the structure produced as a result of the processing steps shown in FIG. 2. Note, however, that in this embodiment the dry HF vapor etch process of FIG. 2D is controlled so as to result in little or no undercut of the BOX 34 beneath the Si layer 36a. In FIG. 6A the layer 42 of Pt is formed by sputtering. As a result the Pt deposition occurs only on those surfaces directly exposed to the flow of sputtered Pt the Si delineated released portion 38 acts as a mask to inhibit Pt deposition on the underlying surface of the Si substrate 32. In this case the Pt layer 42 is formed on the top surfaces of the layer 36a, the released portion 38, that portion of the surface of the Si substrate 32 that is exposed through the apertures 36b, and also on the sidewalls 34a of the BOX cavity. In FIG. 6B the reaction anneal process is performed so as to full silicide the suspended NEMS structure corresponding to the Si delineated released portion 38 having the Pt layer 42. The reaction anneal also fully silicides the Si layer 36a, as well as the underlying portions of the Si substrate 32 having the Pt layer 42 deposited thereon. The reaction anneal can be performed using the conditions: 500° C. 30 seconds in $N_2$. More generally the reaction anneal can be performed at a temperature in a range of about 300° C. to about 750° C. and the time adjusted accordingly.

Figure 6C:
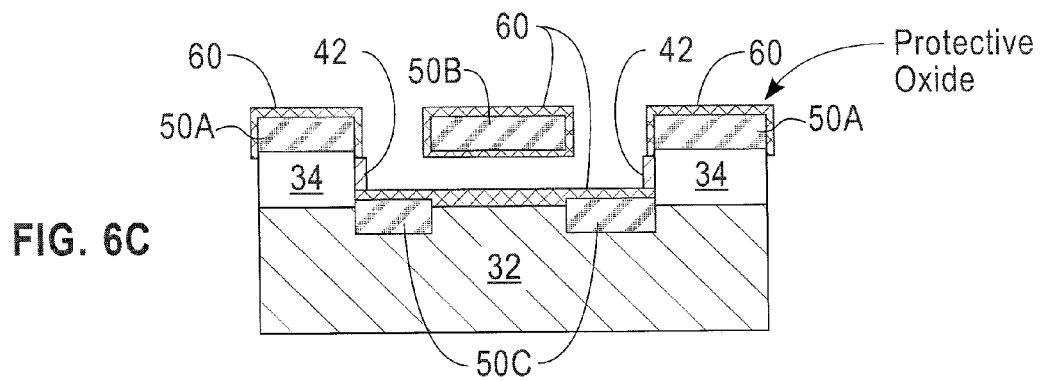

In FIG. 6C, without removing the wafer from the reaction anneal chamber a second anneal at 600° C. for 60 seconds in $O_2$, or 650° C. for 30 seconds in $O_2$, is performed. This rapid thermal anneal in $O_2$ selectively forms a thin $SiO_2$ protective oxide layer 60 only on the PtSi, and not on the unreacted Pt formed on the BOX sidewalls 34a. Reference in this regard can be made to Z. Zhang, S.-L. Zhang and M. Östling, Robust, Scalable Self-Aligned Platinum Silicide Process, *Applied Physics Letters* 88, 142114 (2006).

Figure 6D:
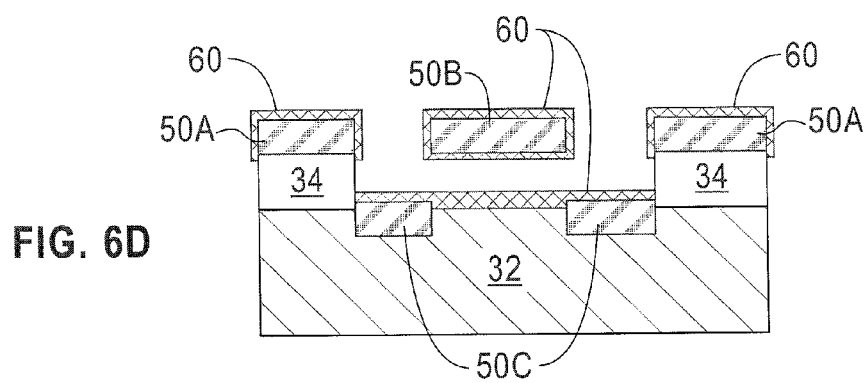
Figure 6E:
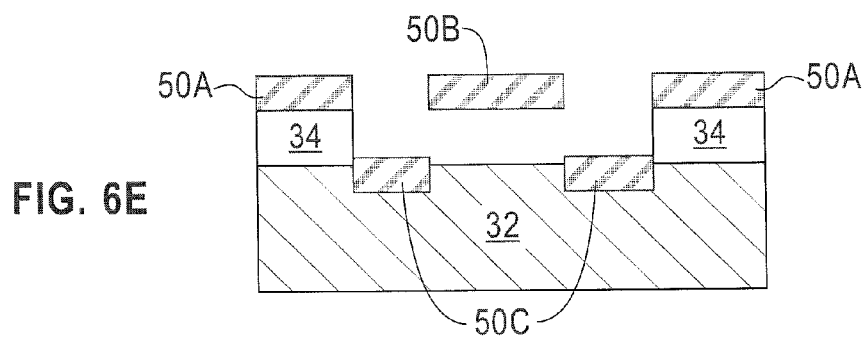

In FIG. 6D a reactive ion etch process is performed to remove the (unprotected) Pt from the BOX sidewalls 34a. The RIE process does not affect the PtSi material beneath the protective $SiO_2$ layer 60. In FIG. 6E a second (dry) vapor HF process is used to remove the protective $SiO_2$ layer 60.

Figure 7:
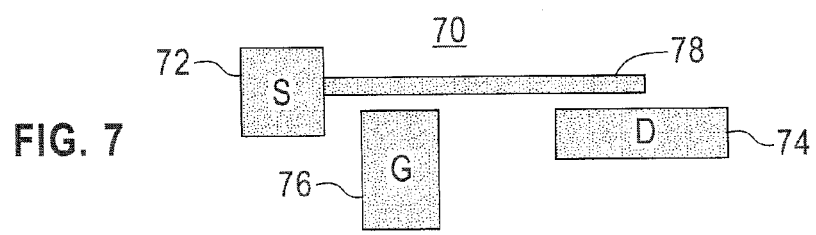
FIG. 7 is an enlarged top-down view of a NEMS device that can be fabricated using the processes of FIGS. 2-6.

FIG. 7 shows a top, enlarged view of a NEMS device 70 that can be fabricated using the processes of FIGS. 2-6. The device 70 is fabricated to include a source (S) 72, a drain (D) 74 and a gate (G) 76. Attached to the source 72 is an elongated electrically conductive fully-silicided member 78 that is capable of flexure and that can function as a switch contact.

Many modifications and variations can become apparent to those of ordinary skill in the art without departing from the scope and spirit of the invention. For example, different materials, metals (e.g., other than Pt such as Ni, W, Er, Yb, Ti, Co), thicknesses, processing steps and parameters can be used, and thus silicides other than PtSi can be formed. Further, the exemplary embodiments are not limited to the fabrication of switches in MEMS or in NEMS devices and structures.

As will be appreciated by one skilled in the art, aspects of the present invention may be embodied as a system, method or computer program product for controlling the processing of the SOI wafer as discussed above in FIGS. 2-6. Thus, aspects of the present invention may take the form of a computer program product embodied in one or more computer readable medium(s) having computer readable program code embodied thereon. Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. The embodiments were chosen and described in order to best explain the principles of the invention and the practical applications thereof, and to enable others of ordinary skill in the art to understand the invention for various embodiments with various modifications as are suited to the particular use contemplated.

As such, various modifications and adaptations may become apparent to those skilled in the relevant arts in view of the foregoing description, when read in conjunction with the accompanying drawings and the appended claims. As but some examples, the use of other similar or equivalent mathematical expressions may be used by those skilled in the art. However, all such and similar modifications of the teachings of this invention will still fall within the scope of this invention.

What is claimed is:

1. A switch, comprising a moveable portion configured to physically move between a first position and a second position, the moveable portion comprising a contact configured to make, when the switch is actuated and the moveable portion is in the first position, an electrical connection between two stationary points, and when the switch is not actuated and the moveable portion is in the second position, to open the electrical connection between the two stationary points, where at least an entirety of said moveable portion including said contact is comprised of a fully silicided material.

2. The switch as in claim 1, where said fully silicided material is comprised of PtSi, or NiSi, or WSi, or ErSi, or YbSi, or TiSi, or CoSi.

3. The switch as in claim 1, comprised of a MEMS or a NEMS switch.

4. A structure, comprising:
   a substrate comprising a silicon layer formed over an insulator layer; and
   a micromechanical switch formed at least partially within the silicon layer, the micromechanical switch comprising a conductive structure comprising a moveable portion configured to physically move between a first position and a second position, the moveable portion comprising a contact configured to make, when the switch is actuated and the moveable portion is in the first position, an electrical connection between two stationary points, and when the switch is not actuated and the moveable portion is in the second position, to open the electrical connection between the two stationary points, where at least an entirety of said moveable portion including electrically contacting portions of the conductive structure and including said contact are comprised of fully silicided material.

5. The structure as in claim 4, where the fully silicided material is comprised of PtSi, or NiSi, or WSi, or ErSi, or YbSi, or TiSi, or CoSi.

6. The structure as in claim 4, where said micromechanical switch is comprised of a MEMS or a NEMS switch.

7. The structure as in claim 4, where at least a moveable portion of said conductive structure is released from said insulator layer.

8. An electro-mechanical switch device fabricated by a process that comprises:

providing a silicon layer disposed over an insulating layer;

releasing a portion of the silicon layer from the insulating layer so that it is at least partially suspended over a cavity in the insulating layer;

depositing a metal on at least one surface of at least the released portion of the silicon layer; and fully siliciding at least the released portion of the silicon layer using the deposited metal, where the fully silicided released portion functions as a moveable current carrying member of the switch device configured to physically move between a first position and a second position, the moveable current carrying member comprising a contact configured to make, when the switch device is actuated and the moveable current carrying member is in the first position, an electrical connection between two stationary points, and when the switch device is not actuated and the moveable current carrying member is in the second position, to open the electrical connection between the two stationary points.

9. The switch device of claim 8, where no wet chemical etching process is performed subsequent to releasing the portion of the silicon layer.

10. The switch device of claim 8, where releasing is performed using a HF vapor.

11. The switch device of claim 8, where depositing a metal is comprised of depositing a layer comprised of carbon so that it fills the cavity, removing a portion of the layer comprised of carbon so as expose a top surface of the released portion of the silicon layer and surrounding portions of the silicon layer, using atomic layer deposition to form the layer of metal on the exposed top surface, and removing the remainder of the layer comprised of carbon prior to fully siliciding.

12. The switch device of claim 8, where the step of releasing forms the cavity so that an underlying top surface of a silicon substrate is exposed at the bottom of the cavity, and where depositing a metal is comprised of applying self-assembled monolayers to sidewalls of the cavity, and using atomic layer deposition to form the layer of metal on exposed surfaces of the released portion of the silicon layer, surrounding portions of the silicon layer, and the exposed surface of the silicon substrate, but not on the sidewalls of the cavity.

13. The switch device of claim 8, where the step of releasing forms the cavity so that an underlying top surface of a silicon substrate is exposed at the bottom of the cavity, and where depositing a metal is comprised of evaporating the metal to form the layer of metal on exposed surfaces of the released portion of the silicon layer, surrounding portions of the silicon layer, the exposed surface of the silicon substrate not underlying the released portion of the silicon layer, but not on the sidewalls of the cavity.

14. The switch device of claim 8, where the step of releasing forms the cavity so that an underlying top surface of a silicon substrate is exposed at the bottom of the cavity, and where depositing a metal is comprised of sputtering the metal to form the layer of metal on exposed surfaces of the released portion of the silicon layer, surrounding portions of the silicon layer, the exposed surface of the silicon substrate not underlying the released portion of the silicon layer, and on sidewalls of the cavity, where fully siliciding silicides the sputtered metal on the released portion of the silicon layer, the surrounding portions of the silicon layer and the exposed surface of the silicon substrate not underlying the released portion of the silicon layer, and further comprising forming a protective oxide layer selectively only on fully silicided surfaces, removing the sputtered metal from the sidewalk of the cavity, and removing the protective oxide layer.

15. The switch device of claim 8, where the metal is comprised of one of Pt, Ni, W, Er, Yb, Ti, Co, and where the fully silicided released portion of the silicon layer is composed of PtSi, or NiSi, or WSi, or ErSi, or YbSi, or TiSi, or Co Si.

16. The switch device of claim 8, where fully siliciding uses a thermal process that is performed in a range of about 300° C. to about 750° C.

17. The switch device of claim 16, where the thermal process is comprised of heating in a nitrogen atmosphere followed by heating in an oxygen atmosphere.

18. The switch device of claim 14, where fully siliciding uses a thermal process that comprises heating in a nitrogen atmosphere, and where forming the protective oxide layer selectively only on fully silicided surfaces comprises heating in an oxygen atmosphere.

19. The switch device of claim 11, where the layer comprised of carbon is removed using a plasma.

20. The switch device of claim 8, where the switch device is one of a MEMS or NEMS switch device.

* * * * *